(12) United States Patent
 Nielsen (10) Patent No.: US 8,219,044 B2
(45) Date of Patent: *Jul. 10, 2012

(54) FEEDBACK COMPENSATION DETECTOR FOR A DIRECT CONVERSION TRANSMITTER

(75) Inventor: Jorgen S. Nielsen, Calgary (CA)

(73) Assignee: Research In Motion Limited, Waterloo (CA)

( * ) Notice: Subject to any disclaimer, the term of this patent is extended or adjusted under 35 U.S.C. 154(b) by 163 days.

This patent is subject to a terminal disclaimer.

(21) Appl. No.: 12/785,607

(22) Filed: May 24, 2010

(65) Prior Publication Data

US 2010/0233974 A1    Sep. 16, 2010

Related U.S. Application Data

(63) Continuation of application No. 12/494,835, filed on Jun. 30, 2009, now Pat. No. 7,725,087, which is a continuation of application No. 11/274,581, filed on Nov. 15, 2005, now abandoned, which is a continuation of application No. 10/145,930, filed on May 15, 2002, now Pat. No. 6,987,954.

(60) Provisional application No. 60/291,239, filed on May 15, 2001.

(51) Int. Cl.
 *H04B 1/04* (2006.01)
(52) U.S. Cl. ...................... 455/114.3; 455/126
(58) Field of Classification Search ............... 455/114.2, 455/114.3, 115.1, 118, 126, 129
 See application file for complete search history.

(56) References Cited

U.S. PATENT DOCUMENTS

| | | | |
|---|---|---|---|
| 5,507,017 | A | 4/1996 | Whitmarsh et al. |
| 5,774,784 | A | 6/1998 | Ohno |
| 5,867,065 | A | 2/1999 | Leyendecker |
| 5,937,335 | A | 8/1999 | Park et al. |
| 5,959,499 | A | 9/1999 | Khan et al. |
| 5,978,662 | A | 11/1999 | Swales |
| 6,275,685 | B1 | 8/2001 | Wessel et al. |
| 6,591,090 | B1 | 7/2003 | Vuorio et al. |
| 6,633,750 | B1 | 10/2003 | Dacus et al. |
| 6,697,436 | B1 | 2/2004 | Wright et al. |
| 6,766,150 | B1 | 7/2004 | Johnson |
| 2002/0065062 | A1 | 5/2002 | Levesque |

*Primary Examiner* — Blane J Jackson
(74) *Attorney, Agent, or Firm* — Jones Day (57) ABSTRACT

A feedback compensation detector for a direct conversion transmitter includes a baseband processor, a direct up-converter, an antenna, and an impairment detection and compensation feedback circuit. The baseband processor generates an in-phase (I) baseband signal and a quadrature-phase (Q) baseband signal. The direct up-converter is coupled to the baseband processor, and combines the I and Q baseband signals with an RF carrier signal to generate an RF output signal. The antenna is coupled to the direct up-converter, and transmits the RF output signal. The impairment detection and compensation feedback circuit is coupled to the RF output signal and the I and Q baseband signals. The impairment detection and compensation feedback circuit down-converts the RF output signal to generate an intermediate frequency (IF) signal, measures at least one signal impairment in the IF signal, and pre-distorts the I and Q baseband signals to compensate for the measured signal impairment.

20 Claims, 10 Drawing Sheets

FEEDBACK COMPENSATION DETECTOR FOR A DIRECT CONVERSION TRANSMITTER

CROSS-REFERENCE TO RELATED APPLICATION

This application is a continuation of U.S. application Ser. No. 12/494,835, filed on Jun. 30, 2009 (now U.S. Pat. No. 7,725,087), which is a continuation of U.S. application Ser. No. 11/274,581, filed on Nov. 15, 2005, which is a continuation of U.S. application Ser. No. 10/145,930, filed on May 15, 2002 (now U.S. Pat. No. 6,987,954), which claims priority from and is related to the following prior application: Feedback Compensation Detector For A Direct Conversion Transmitter And Method Of Operating Same, U.S. Provisional Application No. 60/291,239, filed May 15, 2001. These prior applications, including the entirety of the written descriptions and drawing figures, are hereby incorporated into the present application by reference.

FIELD OF THE INVENTION

This application relates generally to the field of radio frequency (RF) signal transmission. More specifically, a feedback compensation detector for a direct conversion transmitter is provided that is particularly well-suited for use in a Quadrature Amplitude Modulated (QAM) transmitter, but may also provide utility in any transmitter that uses sufficiently independent modulation on the two quadrature axes (I and Q), such as a Code Division Multiple Access (CDMA) transmitter, a Wideband Direct Sequence CDMA (WCDMA) transmitter, or a Global System for Mobile Communications (GSM) transmitter.

BACKGROUND OF THE INVENTION

Direct conversion transmitters are known. In a typical direct conversion transmitter chain, baseband in-phase (I) and quadrature-phase (Q) digital signals are converted to analog signals, filtered, amplified and modulated to form an analog baseband signal. The analog baseband signal is then converted to a radio frequency (RF) signal at a carrier frequency, amplified, filtered, and transmitted via an antenna. Such transmitter chains, however, typically propagate signal impairments which are often resultant from channel delays, imbalances, and other signal distortions occurring within the transmitter chain.

SUMMARY

A feedback compensation detector for a direct conversion transmitter includes a baseband processor, a direct up-converter, an antenna, and an impairment detection and compensation feedback circuit. The baseband processor generates an in-phase (I) baseband signal and a quadrature-phase (Q) baseband signal. The direct up-converter is coupled to the baseband processor, and combines the I and Q baseband signals with an RF carrier signal to generate an RF output signal. The antenna is coupled to the direct up-converter, and transmits the RF output signal. The impairment detection and compensation feedback circuit is coupled to the RF output signal and the I and Q baseband signals. The impairment detection and compensation feedback circuit down-converts the RF output signal to generate an intermediate frequency (IF) signal, measures at least one signal impairment in the IF signal, and pre-distorts the I and Q baseband signals to compensate for the measured signal impairment.

DETAILED DESCRIPTION

Impairment Compensation Feedback Path

Figure 1:
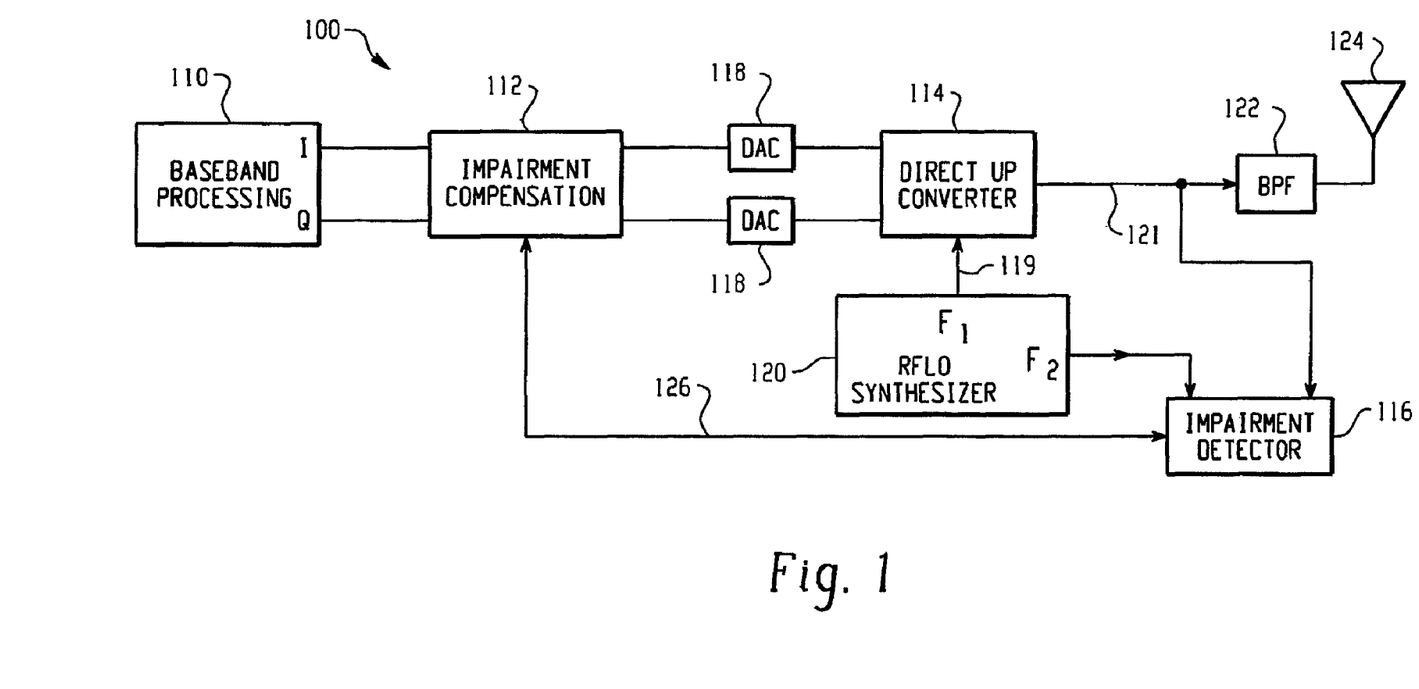
FIG. 1 is a block diagram of a direct up-conversion transmitter chain with an impairment compensation feedback path.

Referring now to the drawing figures, FIG. 1 is a block diagram of a direct up-conversion transmitter chain 100 with an impairment compensation feedback path. The transmitter chain 100 includes a baseband processor 110, an impairment compensator 112, a direct up-converter 114, and an impairment detector 116. The baseband processor 110 may, for example, be a digital signal processor (DSP), a central processing unit (CPU), or some other type of processing device or logic circuitry. The transmitter chain also includes a pair of digital-to-analog converters DACs 118, a frequency synthesizer 120, a band pass filter 122, and an antenna 124. Operationally, the impairment detector 116 measures signal impairments in the direct up-converter output 121, and generates a feedback signal 126 that is coupled to the impairment compensator 112. Exemplary signal impairments which may be detected by the impairment detector 116 are described below with reference to FIG. 3.

The baseband processor 110 generates in-phase (I) and quadrature-phase (Q) digital baseband signals for RF transmission. The I and Q baseband signals are modified prior to analog conversion by the impairment compensator 112, as described below. The modified baseband signals are then converted into the analog domain by the DACs 118 and are coupled to the direct up-converter 114 which combines the analog baseband signals with an RF carrier signal 119 from the frequency synthesizer 120. An exemplary direct up-converter 114 is described below with reference to FIG. 2. The RF output signal 121 from the direct up-converter 114 is filtered by the band pass filter 122, and is transmitted by the antenna 124. In addition, the RF output signal 121 is coupled to the impairment detector 116 which measures signal impairments, as described below, and generates the feedback signal 126 that is coupled to the impairment compensator 112. The feedback signal 126 is used by the impairment compensator 112 to pre-distort the I and Q baseband signals such that the pre-distortion cancels any actual distortion caused by impairments in the direct up-converter 114.

Figure 2:
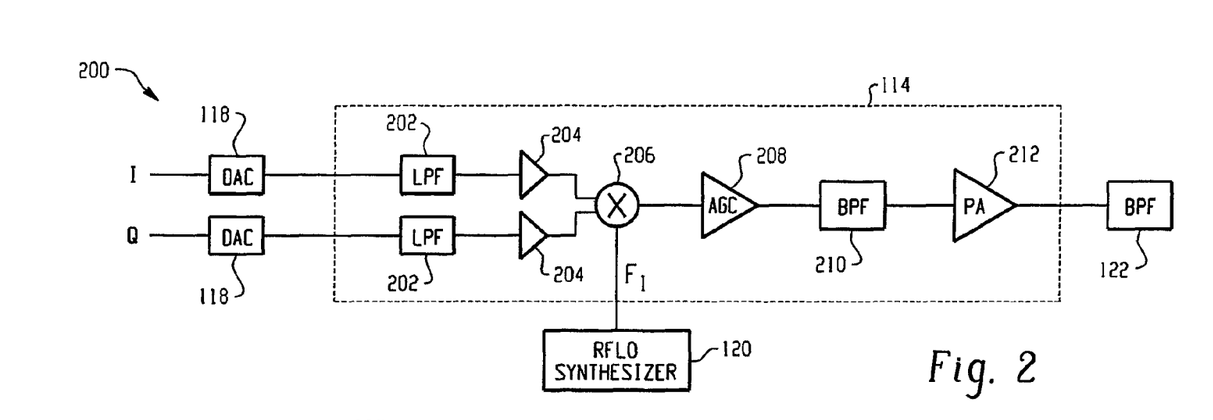
FIG. 2 is a more detailed block diagram of the direct up-converter shown in FIG. 1.

FIG. 2 is a more detailed block diagram 200 of the direct up-converter 114 shown in FIG. 1. The direct up-converter 114 includes a pair of low pass filters 202, a pair of amplifiers 204, a quadrature up-converter 206, an automatic gain control (AGC) amplifier 208, a band pass filter 210, and a power amplifier (PA) 212.

The analog I and Q baseband signals from the DACs 118 are received as inputs to the direct up-converter 114. The I and Q inputs are then filtered by the pair of low pass filters 202, amplified by the pair of amplifiers 204, and coupled as inputs to the quadrature up-converter 206. The quadrature up-converter 206 also receives a carrier signal (F1) from the frequency synthesizer 120, and combines the analog baseband signals with the carrier signal (F1) to generate a radio frequency (RF) signal having a carrier frequency of F1. The RF signal is amplified by the AGC amplifier 208 in order to provide the necessary gain to drive the power amplifier (PA) 212. The PA 212 further amplifies the RF signal to generate the RF output signal 121.

Figure 3:
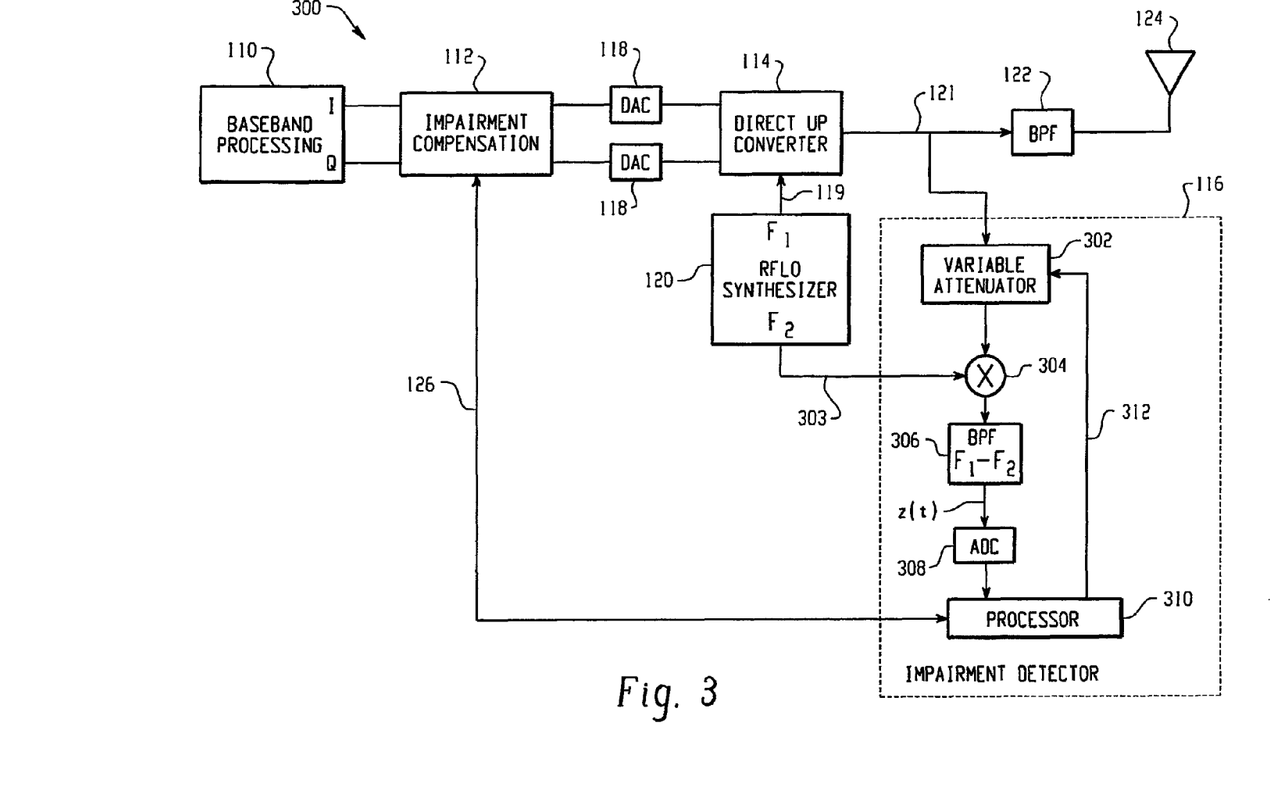
FIG. 3 is a block diagram of the direct up-conversion transmitter chain shown in FIG. 1 with a more detailed illustration of the impairment detector.

FIG. 3 is a block diagram 300 of the direct up-conversion transmitter chain 100 shown in FIG. 1 with a more detailed illustration of the impairment detector 116. The impairment detector 116 includes a variable attenuator 302, a down-conversion mixer 304, a band pass filter 306, an analog-to-digital (A/D) converter 308, and a impairment detector processor 310. The impairment detector processor 310 may, for example, be a digital signal processor (DSP), a central processing unit (CPU), or some other type of processing device or logic circuitry. In one embodiment, the processing functions of the impairment detector processor 310 and the baseband processor 110 described above may be performed by the same processing device.

The RF output signal 121 from the direct up-converter 114 is sampled by the variable attenuator 302 which reduces the gain of the signal 121 to an appropriate power range for the down-conversion mixer 304. The output from the variable attenuator 302 is coupled to the down-conversion mixer 304 along with a local oscillator (LO) signal 303 generated by the frequency synthesizer 120, which has a different frequency ($F_2$) than the frequency ($F_1$) of the RF carrier signal 119. The intermediate frequency (IF) output of the down-conversion mixer 304 thus has a center frequency that is substantially equal to the difference between the frequencies of the LO signal 303 and the RF carrier signal 119 ($F_1-F_2$).

The band pass filter 306 is centered at the intermediate frequency ($F_1-F_2$), and filters the IF output to a pre-determined passband to generate an analog impairment signal z(t), where z is a time domain function and t is time. The analog impairment signal z(t) is sampled by the A/D converter 308, and the resulting digital signal is coupled to the impairment detector processor 310 and may also be stored in a memory device, such as a buffer memory, via the processor 310.

The impairment detector processor 310 is configured to estimate one or more impairments present in the RF signal 121. For instance, the impairment detector processor 310 may be configured to estimate the overall gain of the up-converter chain 100, a leakage component from the LO signal 303, a phase or amplitude imbalance in the quadrature up-converter 206, a differential delay between the I and Q baseband channels, or some other signal impairment. The feedback signal 126 from the impairment detector 116 is generated by the impairment detector processor 310 based on the impairments detected in the RF signal 121 and is applied to the I and Q baseband signals in the impairment compensator 112. In addition, the impairment detector processor 310 generates an attenuation control signal 312 that is fed back to control the negative gain applied by the variable attenuator 302. The relationship between the operations of the impairment detector 116 and the impairment compensator 112, including the estimation of signal impairments by the impairment detector processor 310, is described below with reference to FIGS. 5-9.

Figure 4:
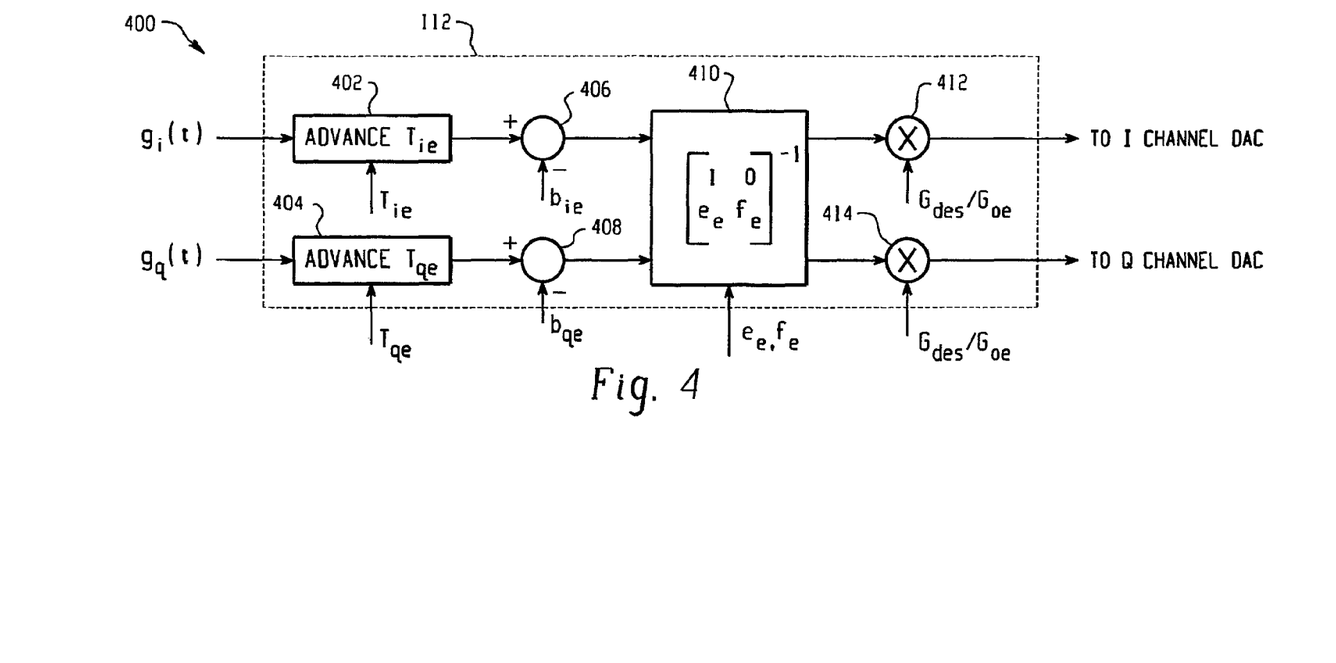
FIG. 4 is a more detailed block diagram of the impairment compensator shown in FIG. 1.

FIG. 4 is a more detailed block diagram 400 of the impairment compensator 112 shown in FIG. 1. The impairment compensator 112 includes in-phase and quadrature-phase delay compensation blocks 402, 404, in-phase and quadrature-phase bias compensation adders 406, 408, a linear compensation block 410, and in-phase and quadrature-phase gain multipliers 412, 414. Also illustrated are the in-phase (I) and quadrature-phase (Q) digital baseband signals from the baseband processor 110, denoted in the time domain as $g_i(t)$ and $g_q(t)$ respectively.

The in-phase and quadrature-phase baseband signals $g_i(t)$ and $g_q(t)$ are advanced by estimated I and Q component delay values, $T_{ie}$ and $T_{qe}$, in the delay compensation blocks 402, 404. The estimated I and Q component delay values $T_{ie}$ and $T_{qe}$ compensate for I and Q component delays from the transmitter chain 100, and are received as inputs from the impairment detector 116. An exemplary method for estimating the I and Q component delay values, $T_{ie}$ and $T_{qe}$, is described below with reference to FIG. 5.

The in-phase and quadrature-phase outputs from the delay compensation blocks 402, 404 are coupled as positive inputs to the in-phase and quadrature-phase bias compensation adders 406, 408. In addition, estimated in-phase and quadrature-phase bias offset values, $b_{ie}$ and $b_{qe}$, derived by the impairment detector 116, are coupled as negative inputs to the in-phase and quadrature-phase bias compensation adders 406, 408. The bias offset values, $b_{ie}$ and $b_{qe}$, compensate for direct-current (DC) bias caused, for example, by leakage of the LO signal 303 in the RF output signal 121 (see FIG. 3). An exemplary method for estimating the bias offset values, $b_{ie}$ and $b_{qe}$, is described below.

The in-phase and quadrature-phase outputs from the bias compensation adders 406, 408 are coupled as inputs to the linear compensation block 410 along with estimated phase and amplitude imbalance parameters, $e_e$ and $f_e$, calculated by the impairment detector 116. Using the estimated phase and amplitude imbalance parameters, $e_e$ and $f_e$, the linear compensation block 410 applies an inverse model of the phase and amplitude imbalance in the quadrature up-converter 206, and outputs balanced in-phase and quadrature-phase signal components. An exemplary method for estimating the phase and amplitude imbalance parameters, $e_e$ and $f_e$, is described below.

The balanced outputs from the linear compensation block 410 are coupled as inputs to the in-phase and quadrature-phase gain multipliers 412, 414. Also coupled as inputs to the gain multipliers 412, 414 is a scaling factor, $G_{des}/G_{oe}$, which adjusts the in-phase and quadrature-phase signals to compensate for gain imbalances. The numerator of the scaling factor, $G_{des}$, represents the desired gain for the transmitter chain 100, and the denominator, $G_{oe}$, is the estimated actual gain. The desired gain $G_{des}$ is pre-selected according to the desired characteristics of the transmitter chain 100. The estimated actual gain $G_{oe}$ may be calculated by the impairment detector 116, as described below. The in-phase and quadrature-phase outputs from the gain multipliers 412, 414 are coupled to the DACs 118, as described above with reference to FIG. 1.

In one alternative embodiment, the impairment detector 112 may be implemented as a software application executing on the baseband processor 110 or on some other processing device.

Estimating I and Q Component Delays ($T_{ie}$ and $T_{qe}$)

Figures 5, 6:
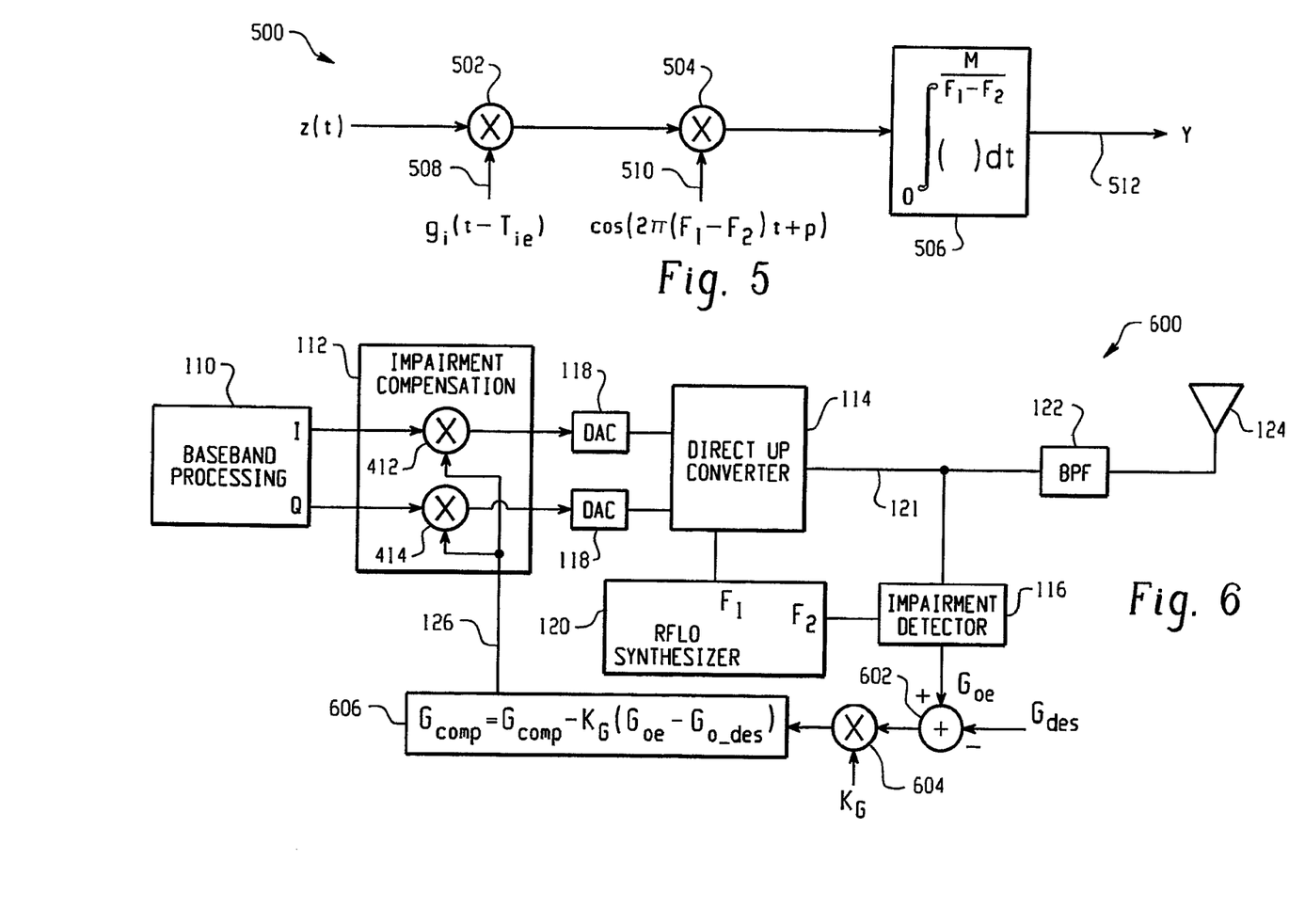
FIG. 5 is a block diagram of a timing estimator circuit for estimating the in-phase (I) component delay, $T_{ie}$, shown in FIG. 4.
FIG. 6 is a block diagram of a direct up-conversion transmitter chain having an automatic gain control (AGC) correction loop in the impairment compensation feedback path.

FIG. 5 is a block diagram 500 of a timing estimator circuit for estimating the I component delay, $T_{ie}$, shown in FIG. 4. The timing estimator circuit 500 may, for example, be implemented by the impairment detector processor 310, and includes a first mixer 502, a second mixer 504, and an integrator 506.

The analog impairment signal z(t), described above with reference to FIG. 3, is coupled as an input to the first mixer 502 along with a delayed in-phase baseband signal $g_i(t-T_{ie})$ 508. The delayed in-phase baseband signal $g_i(t-T_{ie})$ 508 is delayed by an estimated value for the I component delay $T_{ie}$. The output from the first mixer 504 is then coupled as an input to the second mixer 504 along with a sampling phase adjustment parameter 510. The sampling phase adjustment parameter 510 may be calculated as: $\cos(2\pi(F_1-F_2)t+p)$; where $(F_1-F_2)$ is the frequency of the IF output from the down-conversion mixer 304 shown in FIG. 3, and p is a phase parameter. The output from the second mixer 504 is fed into the integrator 506, which integrates the signal over a sampling epoch $(M/(F_1-F_2))$ to produce an output signal (Y) 512, where M is an integer parameter corresponding to the number of integration cycles.

Operationally, the estimated I component delay, $T_{ie}$, is calculated by varying the values of $T_{ie}$ and p until a maximum value is obtained for the timing estimator output (Y) 512. The maximum value for Y may be approximated, for example, by calculating Y 512 over a pre-determined range of the variables $T_{ie}$ and p. The value of $T_{ie}$ that results in the maximum timing estimator output (Y) 512 is an estimate of the total in-phase component delay.

The estimated Q component delay, $T_{iq}$, may be calculated using a timing estimator circuit similar to the circuit 500 shown in FIG. 5 in which the delayed in-phase baseband signal $(g_i(t-T_{ie}))$ is replaced with a delayed quadrature-phase baseband signal $(g_q(t-T_{iq}))$.

Estimating Phase, Amplitude, and Gain Imbalance ($e_e$, $f_e$, and $G_{oe}$)

Referring again to FIG. 4, the linear compensation block 410 uses the phase and amplitude parameters $e_e$ and $f_e$ to compensate for phase and amplitude imbalance in the quadrature up-converter 206, and the in-phase and quadrature-phase gain multipliers 412, 414 use the scaling factor $G_{des}/G_{oe}$ to balance the gain. The phase and amplitude parameters $e_e$ and $f_e$ and the overall gain $G_{oe}$ may be estimated from the analog impairment signal z(t) described above with reference to FIG. 3. The subscript "e" or "est" as used within this application denotes that the value for the given parameter is an estimated value.

The analog impairment signal z(t) may be expressed by the following equation:

$$z(t) = (C(t)a + S(t)c) * g_{ieq}(t-T_i) + (C(t)b + S(t)d) * g_{qeq}(t-T_q);$$

where:

$$g_{ieq}(t) = g_i(t-T_i) + b_i;$$

$$g_{qeq}(t) = g_q(t-T_q) + b_q;$$

$$C(t) = \cos(2\pi(F_1-F_2)t);$$

$$S(t) = \sin(2\pi(F1-F_2)t);$$

and $$\begin{bmatrix} a & b \\ c & d \end{bmatrix} = G_o \begin{bmatrix} \cos(\phi_o) & -\sin(\phi_o) \\ -\sin(\phi_o) & \cos(\phi_o) \end{bmatrix} \begin{bmatrix} 1 & 0 \\ e & f \end{bmatrix}.$$

The matrix coefficients {a, b, c, d} represent the model of the impaired quadrature up-converter with a random start phase $\phi_o$, and may be estimated by sampling z(t). In addition, since the I and Q time delays, $T_i$ and $T_q$, are independent of other impairments, they may be assumed to be equal to zero (0) for the purposes of estimating the phase, amplitude, and gain imbalance parameters, $e_e$, $f_e$, and $G_{oe}$.

Assume that z(t) is sampled such that z(n) is the sample of z(t) at $t=nT_s$, where the value of n ranges from 0 to (N−1) and $N=M(T_s(F_1-F_2))^{-1}$, and where M is an integer parameter corresponding to the number of integration cycles. Also assume that $g_i(t)$ and $g_q(t)$ are independent random processes with zero mean. Then, the matrix coefficients {a, b, c, d} may be estimated as follows:

$$a_e = \frac{\sum_{n=0}^{N-1} z(n)C(n) - g_i(n)}{\sum_{n=0}^{N-1} (C(n))^2 (g_i(n))^2};$$

$$b_e = \frac{\sum_{n=0}^{N-1} z(n)C(n)g_q(n)}{\sum_{n=0}^{N-1} (C(n))^2 (g_q(n))^2};$$

$$c_e = \frac{\sum_{n=0}^{N-1} z(n)S(n)g_i(n)}{\sum_{n=0}^{N-1} (S(n))^2 (g_i(n))^2};\text{ and}$$

$$d_e = \frac{\sum_{n=0}^{N-1} z(n)S(n)g_q(n)}{\sum_{n=0}^{N-1} (S(n))^2 (g_q(n))^2}.$$

The estimated matrix coefficients {$a_e$, $b_e$, $c_e$, $d_e$} may then be used to estimate the phase, amplitude, and gain imbalance parameters, $e_e$, $f_e$, and $G_{oe}$, as follows:

$$e_e = \frac{d_e c_e + b_e a_e}{a_e d_e - c_e b_e};$$

$$f_e = \frac{d_e^2 + b_e^2}{a_e d_e - c_e b_e};$$

and

-continued $$G_{oe} = \frac{a_e d_e - c_e b_e}{\sqrt{b_e^2 + d_e^2}}.$$

Estimating Bias Offset ($b_{ie}$ and $b_{qe}$)

With reference to FIG. 4, the in-phase and quadrature-phase delay compensation blocks 402, 404 offset the I and Q baseband signals by in-phase and quadrature-phase bias parameters $b_{ie}$ and $b_{qe}$. The bias parameters, $b_{ie}$ and $b_{qe}$, may be estimated from the analog impairment signal z(t) independently of the other impairment parameters $e_e$, $f_e$, and $G_{oe}$. The analog impairment signal z(t) 126 may thus be expressed as:

$$z(t) = [\cos(\phi(t))\ \sin(\phi(t))]G_o \begin{bmatrix} 1 & 0 \\ e & f \end{bmatrix}\begin{bmatrix} b_i \\ b_q \end{bmatrix} = [C\ S]\begin{bmatrix} a & b \\ c & d \end{bmatrix}\begin{bmatrix} b_i \\ b_q \end{bmatrix};$$

such that:

$$z(t)=(Ca+Sc)b_i+(Cb+Sd)b_q.$$

The term (Ca+Sc) may be regarded as a vector in the two-dimensional Hilbert space of C(t) and S(t), and an orthogonal vector to (Ca+Sc) is (Cc−Sa). Consequently <(Ca+Sc)(Cc−Sa)>=0, which allows the parameters $b_i$ and $b_q$ to be extracted from the equation. Thus estimates of $b_i$ and $b_q$, denoted as $b_{ie}$ and $b_{qe}$, may be derived as:

$$b_{ie} = \frac{\sum_{n=0}^{N-1} z(n)(C(n)c_e - S(n)a_e)}{\sum_{n=0}^{N-1}(C(n)c_e - S(n)a_e)(C(n)b_e + S(n)d_e)}$$

$$= \frac{2\sum_{n=0}^{N-1} z(n)(C(n)c_e - S(n)a_e)}{a_e d_e - b_e c_e};$$

and $$b_{qe} = \frac{\sum_{n=0}^{N-1} z(n)(C(n)d_e - S(n)b_e)}{a_e d_e - b_e c_e}.$$

Automatic Gain Control Correction Loop

FIG. 6 is a block diagram of a direct up-conversion transmitter chain 600 having an automatic gain control (AGC) correction loop in the impairment compensation feedback path. This transmitter chain 600 is similar to the transmitter chain 100 described above with reference to FIGS. 1-5, except the feedback path includes a comparator 602, a mixer 604, and a gain correction loop 606. In operation, the AGC loop compensates for errors in the AGC amplifier 208 described above with reference to FIG. 2.

The comparator 602 has a positive input coupled to the estimated gain $G_{oe}$ from the impairment detector 116 and a negative input coupled to the pre-selected desired gain $G_{des}$. The comparator 602 subtracts the desired gain $G_{des}$ from the estimated gain $G_{oe}$ to generate a comparator output that is coupled as an input to the mixer 604. The mixer 604 applies a pre-selected gain coefficient $K_G$ to the comparator output, and generates a mixer output that is coupled as an input to the gain correction loop 606. The gain correction loop 606 may, for example, be a first order correction loop that generates a gain-compensated output $G_{comp}$ that may be expressed by the equation: $G_{comp}=G_{comp}-K_G(G_{oe}-G_{des})$. Accordingly, the speed at which the AGC correction loop 606 will track AGC errors may be increased by increasing the value of the gain coefficient $K_G$.

The gain-compensated output, $G_{comp}$, from the AGC correction loop 606 is coupled as the inputs to the gain multipliers 412, 414 in the impairment compensator 112, as described above with reference to FIG. 4. It should be understood, that although the impairment compensator 112 illustrated in FIG. 6 has been simplified to show only the gain multipliers 412, 414, the impairment compensator 112 may include the additional elements described above with reference to FIG. 4.

Local Oscillator Leakage Nulling Loop

Figure 7:
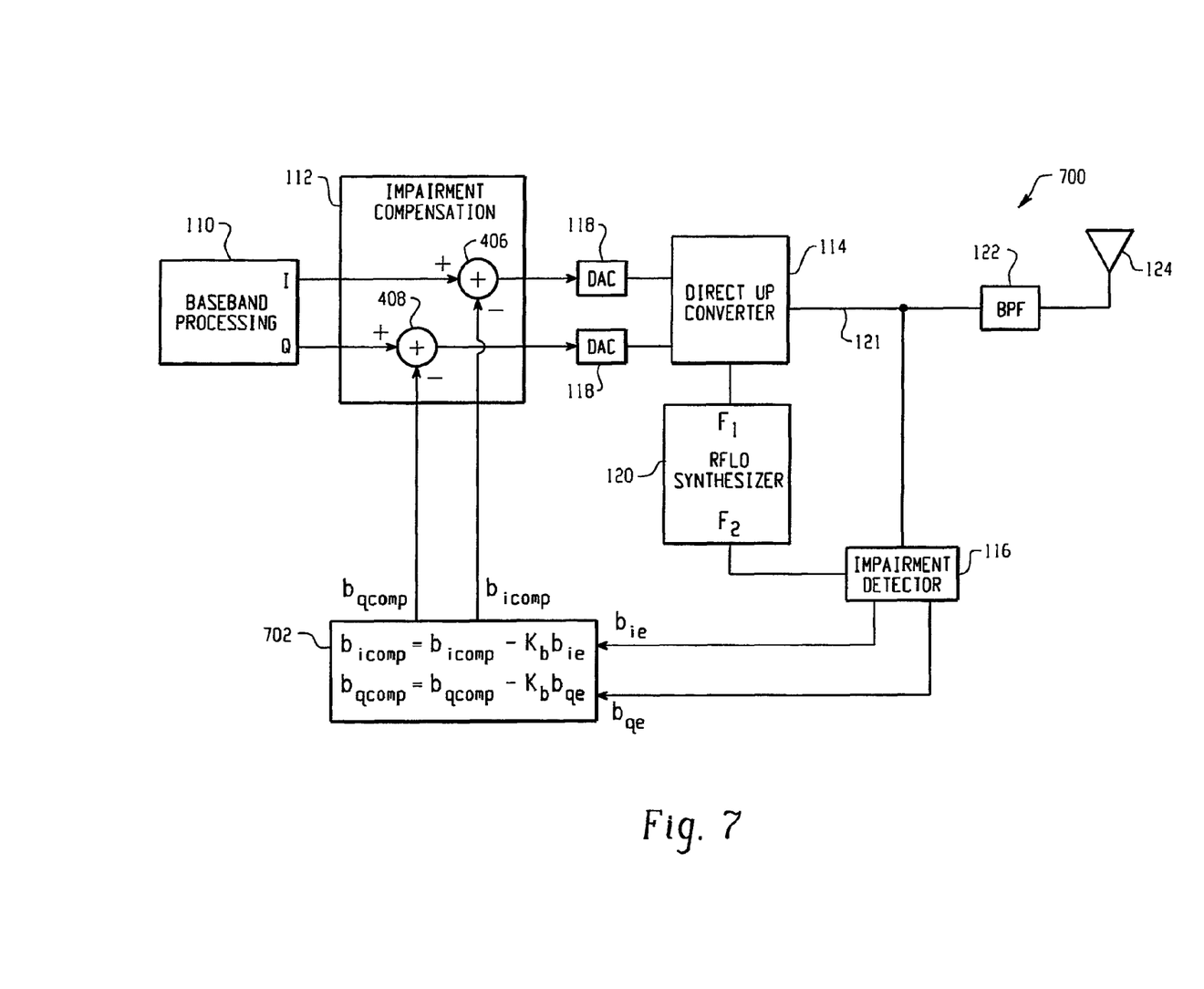
FIG. 7 is a block diagram of a direct up-conversion transmitter chain having a local oscillator (LO) leakage nulling loop in the impairment compensation feedback path.

FIG. 7 is a block diagram of a direct up-conversion transmitter chain 700 having a local oscillator (LO) leakage nulling loop 702 in the impairment compensation feedback path. This transmitter chain 700 is similar to the transmitter chain 100 described above with reference to FIGS. 1-5, except for the inclusion of the LO leakage nulling loop 702 in the feedback path. In operation, the LO leakage nulling loop 702 corrects for corruption of the RF signal 121 caused by the LO signal 303.

The LO signal 303 may be suppressed in the RF signal 121 by nulling the DC bias parameters $b_{ie}$ and $b_{qe}$. The LO leakage nulling loop 702 accomplishes this by implementing a first order correction loop that applies a pre-selected bias coefficient $K_b$, and generates compensated in-phase and quadrature-phase bias offset parameters, $b_{icomp}$ and $b_{qcomp}$, according to the equations:

$$b_{icomp}=b_{icomp}-K_b b_{ie};\text{ and}$$

$$b_{qcomp}=b_{qcomp}-K_b b_{qe}.$$

The compensated in-phase and quadrature-phase bias offset parameters, $b_{icomp}$ and $b_{qcomp}$, are coupled as inputs to the in-phase and quadrature-phase bias compensation adders 406, 408, as described above with reference to FIG. 4. It should be understood, that although the impairment compensator 112 illustrated in FIG. 7 has been simplified to show only the bias compensation adders 406, 408, the impairment compensator 112 may include the additional elements described above with reference to FIG. 4.

Quadrature Imbalance Compensation Tracking Loop

Figure 8:
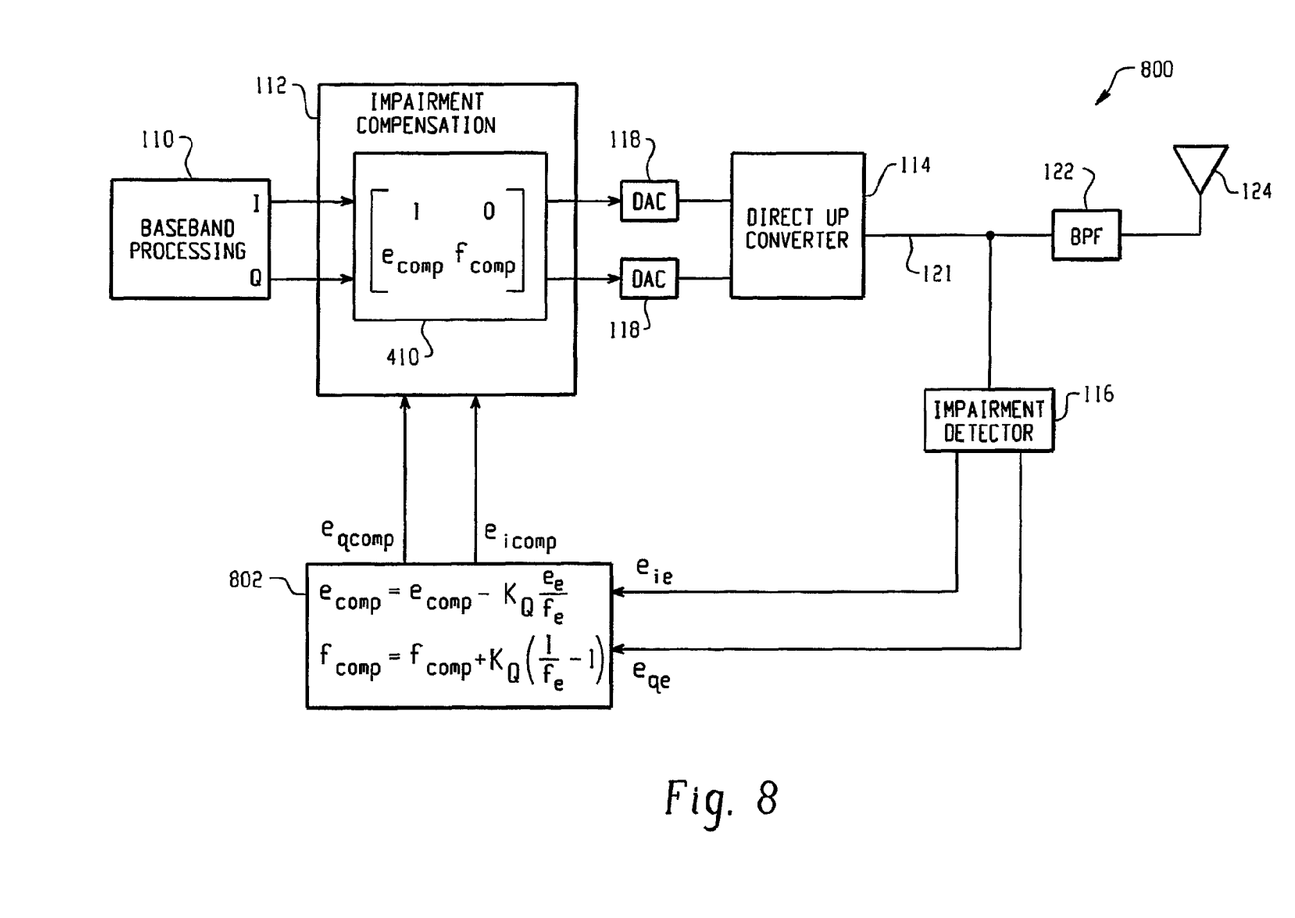
FIG. 8 is a block diagram of a direct up-conversion transmitter chain having a quadrature imbalance compensation loop in the impairment compensation feedback path.

FIG. 8 is a block diagram of a direct up-conversion transmitter chain 800 having a quadrature imbalance compensation loop 802 in the impairment compensation feedback path. This transmitter chain 800 is similar to the transmitter chain 100 described above with reference to FIGS. 1-5, except for the inclusion of the quadrature imbalance compensation loop 802 in the feedback path. In operation, the quadrature imbalance compensation loop 802 further compensates for phase and amplitude imbalance in the quadrature up-converter 206.

The phase and gain imbalance of the quadrature up-converter 206 is represented by the phase and amplitude parameters "e" and "f" as described above. In order to compensate for phase and amplitude imbalance, the I and Q components of the baseband signal are multiplied by:

$$\begin{bmatrix} 1 & 0 \\ e & f \end{bmatrix}^{-1} = \begin{bmatrix} 1 & 0 \\ -\frac{e}{f} & \frac{1}{f} \end{bmatrix} = \begin{bmatrix} 1 & 0 \\ e_{comp} & f_{comp} \end{bmatrix},$$

where $e_{comp}$ and $f_{comp}$ are the desired compensation variables tracked by the quadrature imbalance compensation loop 802. If values of the phase and amplitude parameters, e and f, where known, then the desired compensation variables could be calculated according to the equations:

$$e_{comp} = -\frac{e}{f};$$

and $$f_{comp} = \frac{1}{f}.$$

Since the impairment detector 116 only calculates estimated phase and amplitude parameters, $e_e$ and $f_e$, however, the quadrature imbalance compensation loop 802 applies a pre-selected quadrature balancing coefficient $K_Q$ to calculate the desired compensation variables, $e_{comp}$ and $f_{comp}$. The quadrature imbalance compensation loop 802 may, for example, be a first order loop correction loop that generates the desired compensation variables, $e_{comp}$ and $f_{comp}$, according to the following equations:

$$e_{comp} = e_{comp} - K_Q \frac{e_e}{f_e};$$

and $$f_{comp} = f_{comp} + K_Q\left(\frac{1}{f_e} - 1\right).$$

The desired compensation variables, $e_{comp}$ and $f_{comp}$, are coupled as inputs to the linear compensation block 410 of the impairment compensator 112, as described above with reference to FIG. 4. It should be understood, that although the impairment compensator 112 illustrated in FIG. 8 has been simplified to show only the linear compensation block 410, the impairment compensator 112 may include the additional elements described above with reference to FIG. 4.

Differential Timing Error Compensation Loop

Figure 9:
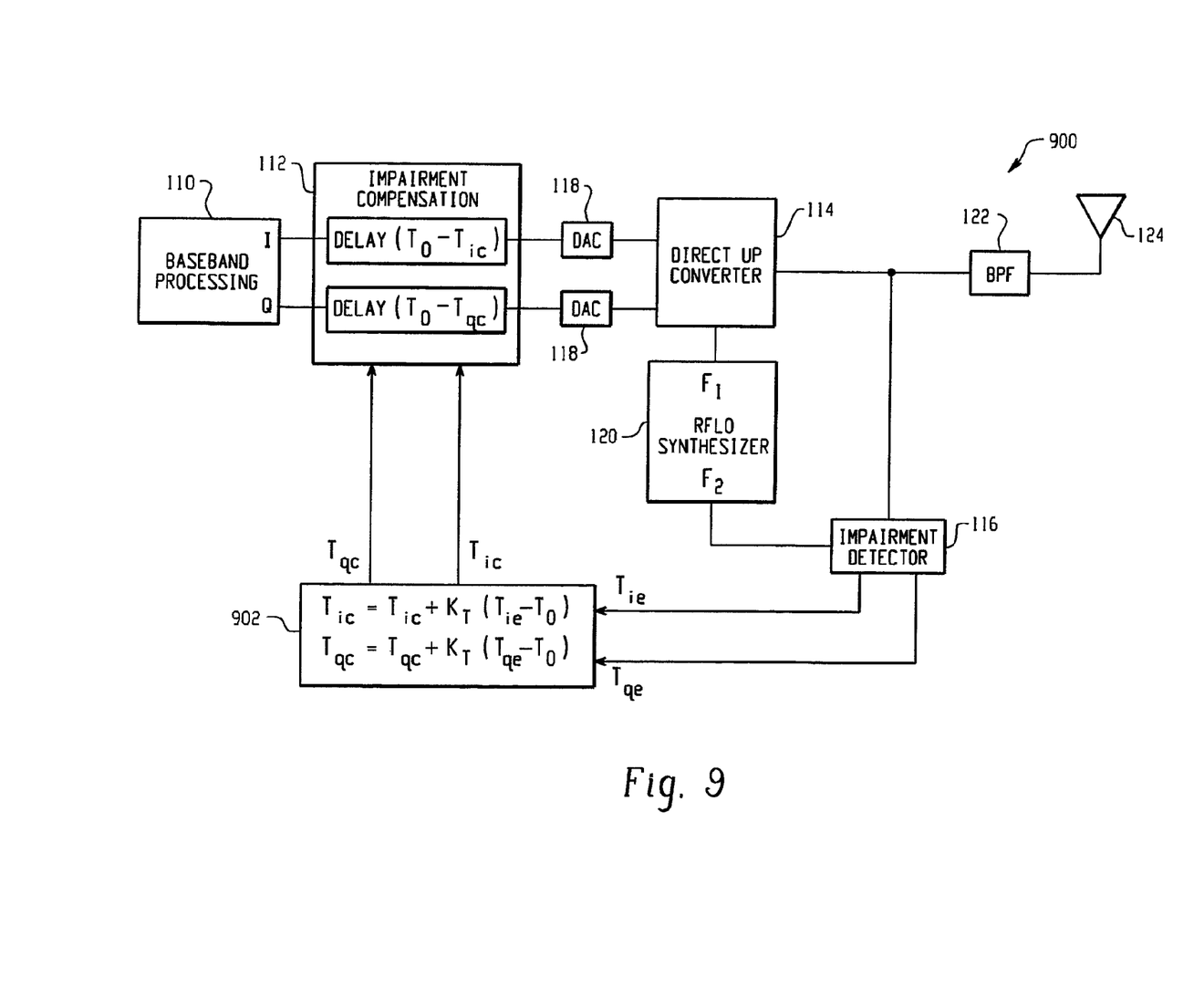
FIG. 9 is a block diagram of a direct up-conversion transmitter chain having a differential timing error compensation loop in the impairment compensation feedback path.

FIG. 9 is a block diagram of a direct up-conversion transmitter chain 900 having a differential timing error compensation loop 902 in the impairment compensation feedback path. This transmitter chain 900 is similar to the transmitter chain 100 described above with reference to FIGS. 1-5, except for the inclusion of the differential timing error compensation loop 902 in the feedback path. In operation, the differential timing error compensation loop 902 adjusts the I and Q component delays, $T_{ie}$ and $T_{qe}$, to compensate for dynamic changes in the up-converter channel delays.

The differential timing error compensation loop 902 receives the in-phase and quadrature-phase component delays, $T_{ie}$ and $T_{qe}$, estimated by the impairment detector 116 as described above, and applies a pre-selected timing adjustment coefficient $K_T$ to generate compensated in-phase and quadrature-phase component delays, $T_{qc}$ and $T_{ic}$. The differential timing error compensation loop 902 may, for example, be implemented as a first order correction loop that generates the compensated component delays, $T_{qc}$ and $T_{ic}$, according to the following equations:

$$T_{ic} = T_{ic} + K_T(T_{ie} - T_o);\text{ and}$$

$$T_{qc} = T_{qc} + K_T(T_{ie} - T_o),$$

where $T_o$ is a target common delay of the in-phase and quadrature-phase channels that is pre-selected such that the delay implemented by the impairment compensator 112 is always positive.

The compensated component delays, $T_{qc}$ and $T_{ic}$, are coupled as inputs to the in-phase and quadrature-phase delay compensation blocks 402, 404 in the impairment compensator 112, as described above with reference to FIG. 4. It should be understood, that although the impairment compensator 112 illustrated in FIG. 9 has been simplified to show only the delay compensation blocks 402, 404, the impairment compensator 112 may include the additional elements described above with reference to FIG. 4.

Detector Temperature and Supply Voltage Compensation

Figure 10:
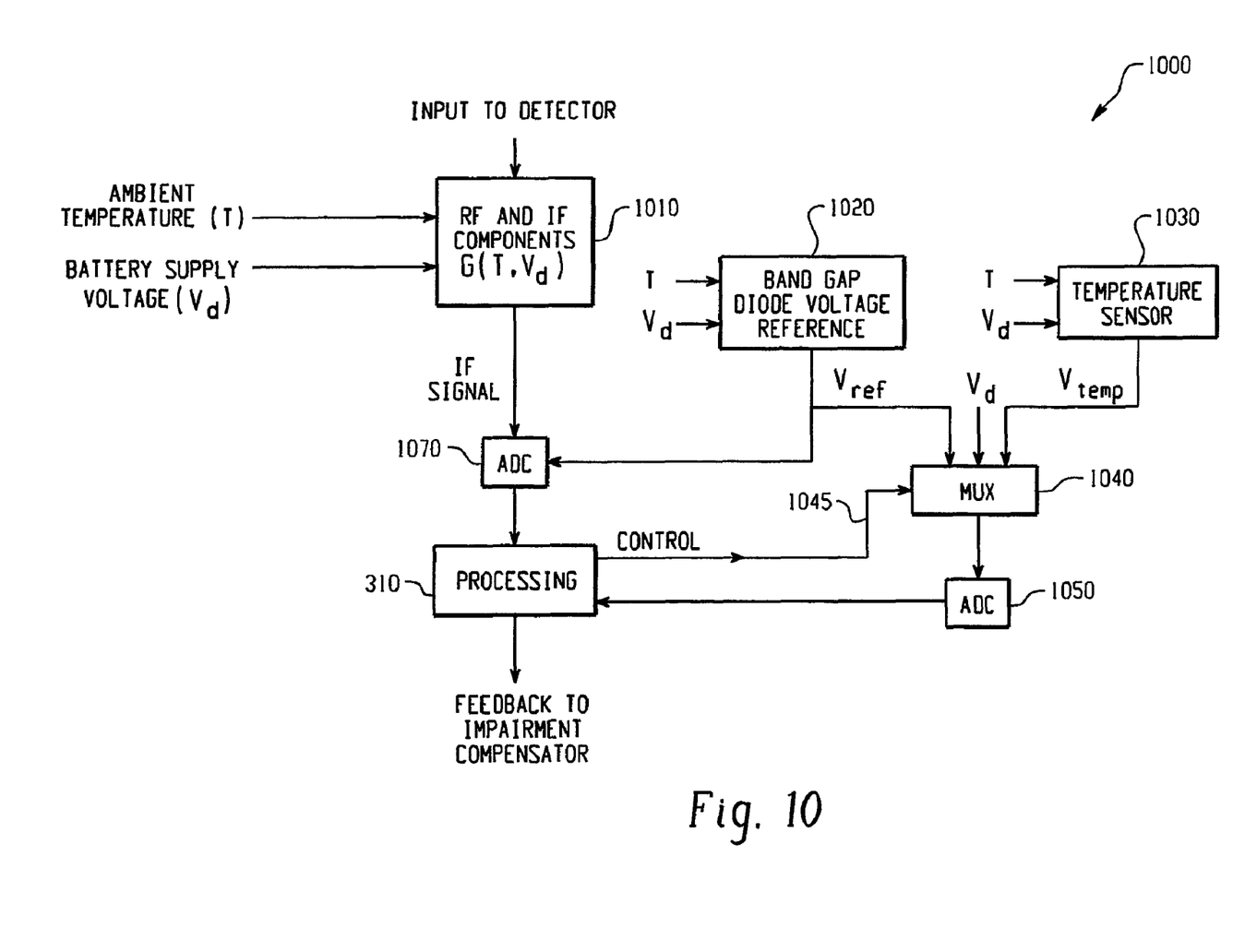
FIG. 10 is a block diagram of an exemplary temperature and supply voltage compensation circuit for the impairment detector shown in FIGS. 1, 3, and 6-9.

FIG. 10 is a block diagram of an exemplary temperature and supply voltage compensation circuit 1000 for the impairment detector 116 shown in FIGS. 1, 3, and 6-9. Portions of the impairment detector 116 described above may be sensitive to fluctuations in temperature and supply voltage. These temperature and supply voltage sensitive components may, for example, include the variable attenuator 302, the down-conversion mixer 304 and the A/D converter 308 described above with reference to FIG. 3. These and any other temperature and/or voltage sensitive components are represented in FIG. 10 by the RF and IF component block 1010. In addition, the temperature and supply voltage compensation circuit 1000 also includes a band gap voltage reference 1020, a temperature sensor 1030, a multiplexer 1040, a first analog-to-digital (A/D) converter 1050, a processor 310, and a second analog-to-digital (A/D) converter 1070. The temperature sensor 1030 may, for example, be a device that is sensitive to temperature and has a repeatable response and negligible hysteresis, such as a diode detector. The processor 310 may, for example, be the impairment detector processor 310 described above with reference to FIG. 3.

The band gap voltage reference 1020 generates a reference voltage $V_{ref}$. Since the band gap voltage reference 1020 is not ideal, however, the reference voltage is a function of the ambient temperature T and the battery supply voltage $V_d$.

The temperature sensor 1030 generates a temperature sensor voltage, $V_{temp}$, which is proportional to the ambient temperature T. Since the temperature sensor 1030 is not ideal, however, its output, $V_{temp}$, is also a function of the battery supply voltage $V_d$.

The multiplexer 1040 is coupled to the reference voltage $V_{ref}$, the temperature sensor voltage $V_{temp}$, and the battery supply voltage $V_d$. In addition, the multiplexer 1040 also receives a control input 1045 from the processor 310 which selects either $V_{temp}$ or $V_d$ as a selected input to the multiplexer 1040. The multiplexer 1040 then divides the selected input, $V_{temp}$ or $V_d$, by the reference voltage $V_{ref}$ to generate an analog ratio output $R_{temp}$ or $R_{vd}$, as follows:

$$R_{temp} = V_{temp}/V_{ref};\text{ and}$$

$$R_{vd} = V_d/V_{ref}.$$

The selected analog ratio output, $R_{temp}$ or $R_{vd}$, is sampled by the first A/D converter 1050 and coupled as an input to the processor 310. The processor 310 may, for example, alternate between selecting $V_{temp}$ and $V_d$ as the selected input to the multiplexer 1040 in order to generate alternating sampled $R_{temp}$ and $R_{vd}$ inputs to the processor 310. In addition, the analog intermediate frequency (IF) signal generated by the temperature and supply voltage sensitive components 1010 in the impairment detector is sampled by the second A/D converter 1070 and coupled as an additional input to the processor 310. In operation, the processor 310 uses the sampled ratios, $R_{temp}$ and $R_{vd}$, to estimate the actual ambient temperature T and supply voltage $V_d$ (the estimated values of T and $V_d$ are designated herein as $T_{est}$ and $V_{dest}$ respectively). A method for estimating the values of T and $V_d$ is described below with reference to FIG. 11.

The estimated temperature and supply voltage values, $T_{est}$ and $V_{dest}$, are used to estimate the overall gain $G(T_{est}, V_{dest})$ of the analog portion of the impairment detector 116, which is a function of both the ambient temperature T and the supply voltage $V_d$. By comparing the estimated overall gain $G(T_{est}, V_{dest})$ to the pre-selected desired gain of the impairment detector 116, the processor 310 compensates for temperature- and supply voltage-related impairments in the analog IF signal by correcting one or more of the parameters in the feedback signal 126 described above. For instance, temperature- and supply voltage-related corrections in the analog IF signal may be implemented by adjusting the estimated gain $G_{oe}$, described above with reference to FIGS. 4 and 6, by a factor of $G(T_{est}, V_{dest})$.

Figure 11:
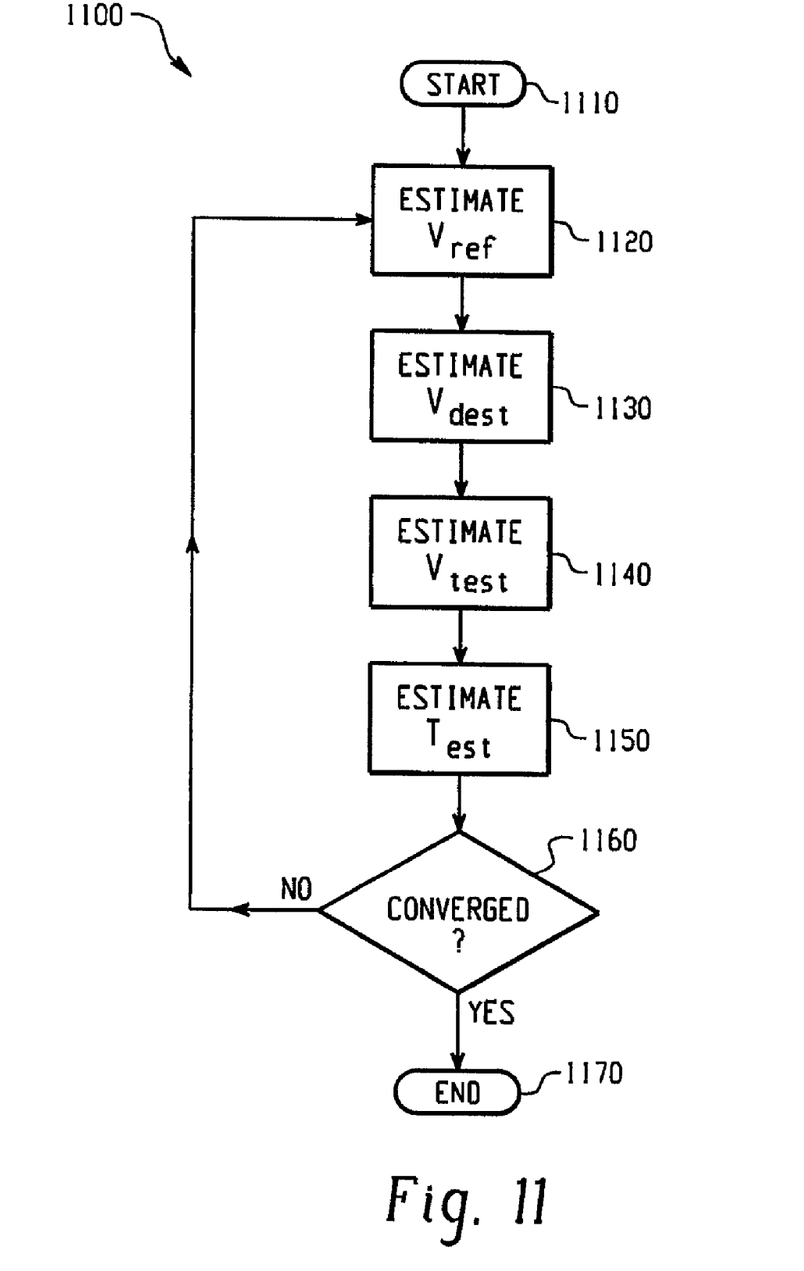
FIG. 11 is a flow diagram of a method for iteratively estimating the values of the ambient temperature T and battery supply voltage $V_d$ shown in FIG. 10.

FIG. 11 is a flow diagram that illustrates a method 1100 for iteratively estimating the values of the ambient temperature T and battery supply voltage $V_d$ shown in FIG. 10. The method 1100 may, for example, be performed by the processor 310 described above with reference to FIG. 10.

The method 1100 begins in step 1110. In step 1120, the voltage value of the reference voltage output $V_{ref}$ from the band gap voltage reference 1020 is estimated. The reference voltage $V_{ref}$ may be calculated, for example, using the estimated values for the ambient temperature $T_{est}$ and the supply voltage $V_{dest}$, according to the following equation:

$$V_{ref} = C_1 + C_2 T_{est} + C_3 V_{dest};$$

where $C_1$, $C_2$ and $C_3$ are constants that may be derived as part of a calibration process. The initial values of $T_{est}$ and $V_{dest}$ may be pre-selected or otherwise initialized, and therefore should be in error. In successive iterations of the method 1100, however, the values of $T_{est}$ and $V_{dest}$ should converge on their respective actual values, and thus the estimated value of $V_{ref}$ should also converge on its actual value.

In step 1130, the estimated value of the battery supply voltage, $V_{dest}$, is calculated. The value of $V_{dest}$ may, for example, be calculated according to the equation:

$$V_{dest} = R_{vd} V_{ref};$$

where $R_{vd}$ is a sampled ratio output from the first multiplexer 1040 described above, and $V_{ref}$ is the voltage reference output from the band gap voltage reference 1020. Similarly, in step 1140, the value of the temperature sensor voltage, $V_{temp}$, as described above, is estimated according to the equation:

$$V_{test} = R_{temp} V_{ref};$$

where $R_{temp}$ is a sampled ratio output from the first multiplexer 1040. Then, in step 1150, the ambient temperature T is estimated according to the equation:

$$T_{est} = (V_{test} - C_4 - C_6 V_{dest}) / C_5;$$

where $C_4$, $C_5$ and $C_6$ are constants that may be derived as part of a calibration process.

In step 1160, the estimated values, $V_{dest}$ and $T_{est}$, for the ambient temperature T and supply voltage $V_d$ are examined to determine if the values have sufficiently converged with their respective actual values. This step 1160 may be performed, for example, by saving the values of $V_{dest}$ and $T_{est}$ to a memory device at each iteration of the method 1100, and comparing the current values with stored values. The estimated values, $V_{dest}$ and $T_{est}$, may be deemed to have sufficiently converged when the difference between values calculated at successive iterations reaches a pre-selected value. If it is determined in step 1160 that either of the estimated values, $V_{dest}$ or $T_{est}$, has not sufficiently converged with its actual value, then the method repeats at step 1120. Otherwise, the method 1100 ends at step 1170.

Method of Operating a Feedback Compensation Detector

Figure 12:
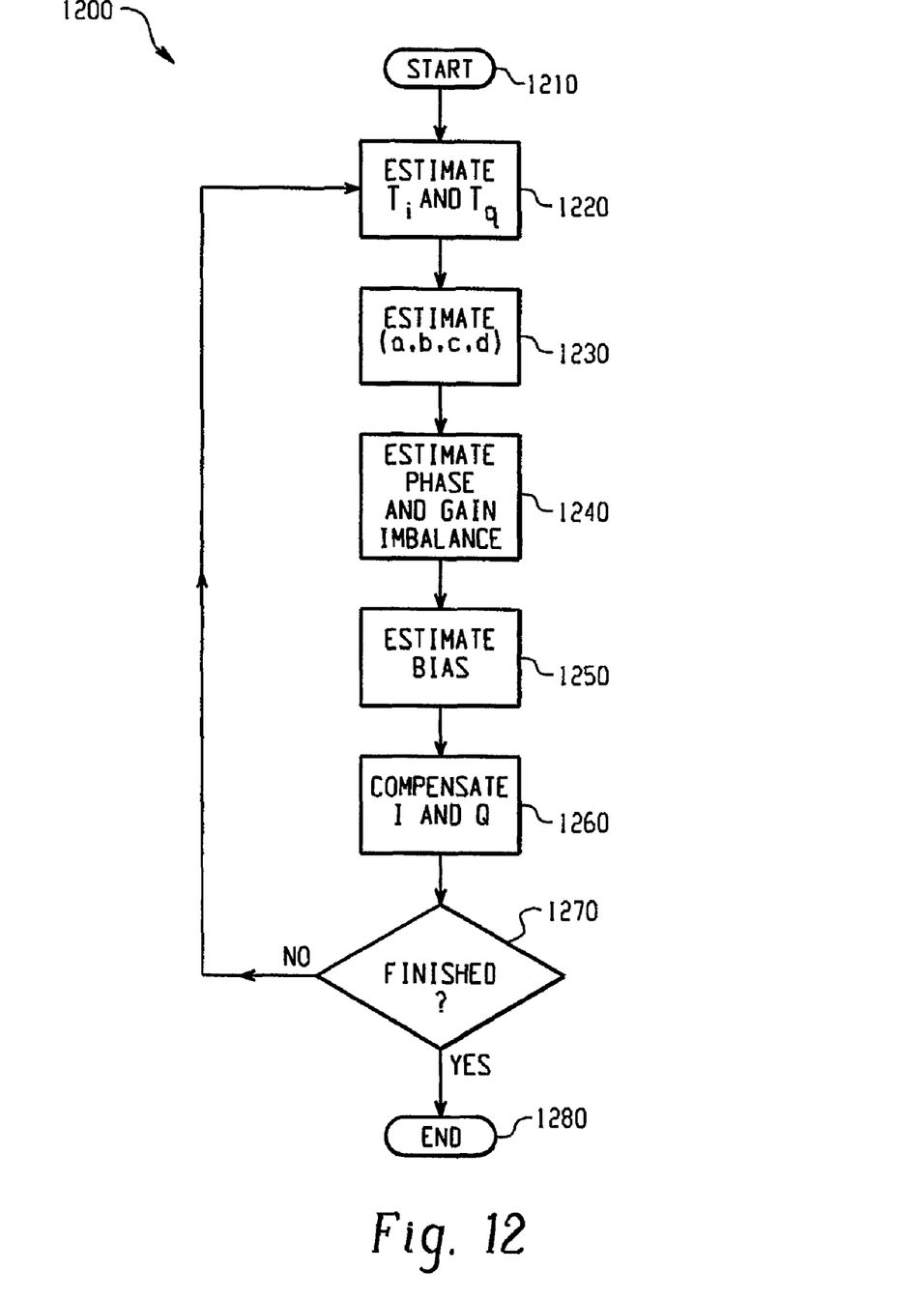
FIG. 12 is a flow diagram illustrating an exemplary method for operating the feedback compensation detector described above with reference to FIGS. 1-9.

FIG. 12 is a flow diagram illustrating an exemplary method 1200 for operating the feedback compensation detector described above with reference to FIGS. 1-9. The method begins in step 1210. In step 1220, the in-phase and quadrature-phase component delays $T_i$ and $T_q$ are estimated, as described above with reference to FIG. 5. In steps 1230-1250, the matrix coefficients {a, b, c, d}, the phase, amplitude and gain imbalances ($e_e$, $f_e$, and $G_{oe}$), and the bias offset values ($b_{ie}$ and $b_{qe}$) are estimated, as described above with reference to FIG. 4. Then, in step 1260, the I and Q baseband signals are compensated using one or more of the estimated impairment parameters, as described above with reference to FIGS. 4-9. If control loops, such as those described above with reference to FIGS. 6-9, are utilized in the I and Q baseband signal compensation step 1260, then the method 1280 may repeat at step 1270. Otherwise, the method 1200 ends at step 1280.

This written description uses examples to disclose the invention, including the best mode, and also to enable any person skilled in the art to make and use the invention. The patentable scope of the invention is defined by the claims, and may include other examples that occur to those skilled in the art.

I claim:

1. A direct up conversion transmitter chain, comprising:
   a baseband processor that generates a baseband signal;
   a direct up-converter that combines the baseband signal with a radio frequency (RF) carrier signal to generate an RF output signal;
   an antenna that transmits the RF output signal;
   an impairment detection and compensation feedback circuit that down-converts the RF output signal to generate an intermediate frequency (IF) signal, measures at least one signal impairment in the IF signal, and pre-distorts the baseband signal to compensate for the measured signal impairment;
   a band gap voltage reference that generates a reference voltage as a function of both an ambient temperature in the vicinity of the impairment detection and compensation feedback circuit and a battery supply voltage;
   wherein the direct up conversion transmitter chain estimates actual values for the ambient temperature and the battery supply voltage and adjusts the signal impairment by a function of the estimated ambient temperature and the estimated battery supply voltage.

2. The direct up conversion transmitter chain of claim 1, wherein the baseband signal generated by the baseband processor is a digital signal, and further comprising:
   a digital-to-analog converter that converts the digital baseband signal into an analog baseband signal.

3. The direct up conversion transmitter chain of claim 2, further comprising:
   a frequency synthesizer having a first frequency output and a second frequency output, wherein the frequency synthesizer generates the RF carrier signal at the first frequency output and generates a local oscillator (LO) signal at the second frequency output, wherein the impairment detection and compensation feedback circuit uses the LO signal to convert the RF output signal to the IF signal.

4. The direct up conversion transmitter chain of claim 1, further comprising:

a band pass filter that filters the RF output signal to a passband frequency range before transmission by the antenna.

5. The direct up conversion transmitter chain of claim 1, wherein the impairment detection and compensation feedback circuit includes an impairment detector that down-converts the RF output signal to generate the IF signal, estimates the signal impairment in the IF signal, and generates a feedback signal that is used by the impairment detection and compensation feedback circuit to pre-distort the baseband signal.

6. The direct up conversion transmitter chain of claim 5, wherein the impairment detector comprises:
a down-conversion mixer coupled to a local oscillator (LO) signal that combines the RF output signal with the local oscillator (LO) signal to generate the IF signal, wherein the frequency of the LO signal is different from the frequency of the RF carrier signal; and
an impairment detector processor that estimates the signal impairment in the RF output signal using the IF signal and generates the feedback signal.

7. The direct up-conversion transmitter chain of claim 6, wherein the impairment detector further comprises:
a variable attenuator that reduces the gain of the RF output signal.

8. The direct up-conversion transmitter chain of claim 6, wherein the impairment detector further comprises:
a band pass filter that filters the IF signal to a passband frequency range to generate an analog impairment signal; and
an analog-to-digital converter that samples the analog impairment signal to generate a digital impairment signal.

9. The direct up conversion transmitter chain of claim 1, wherein the impairment detection and compensation feedback circuit includes an impairment compensator that receives a feedback signal generated by the impairment detection and compensation feedback circuit and uses at least one signal impairment parameter in the feedback signal to pre-distort the baseband signal.

10. The direct up conversion transmitter chain of claim 9, wherein the impairment detection and compensation feedback circuit estimates a component delay in the RF output signal and generates a delay compensation value in the feedback signal that is proportional to the estimated component delay, and wherein the impairment compensator comprises:
a delay compensation block that advances the baseband signal by the delay compensation value.

11. The direct up conversion transmitter chain of claim 9, wherein the impairment detection and compensation feedback circuit estimates direct-current (DC) bias in the RF output signal and generates a bias offset value in the feedback signal that is proportional to the estimated DC bias, and wherein the impairment compensator comprises:
a bias compensation adder having a positive input that subtracts the bias offset value from the baseband signal.

12. The direct up conversion transmitter chain of claim 9, wherein the impairment detection and compensation feedback circuit estimates phase and amplitude imbalance in the transmitter chain and generates a phase imbalance parameter and an amplitude imbalance parameter in the feedback signal, and wherein the impairment compensator comprises:
a linear compensation block that uses the phase and amplitude imbalance parameters to apply an inverse model of the estimated phase and amplitude imbalance to the baseband signal.

13. The direct up conversion transmitter chain of claim 9, wherein the impairment detection and compensation feedback circuit estimates the overall gain of the transmitter chain and generates a scaling factor in the feedback signal that is a function of the estimated gain and a pre-selected desired gain of the transmitter chain, and wherein the impairment compensator comprises:
a gain multiplier that multiplies the baseband signal by the scaling factor.

14. The direct up conversion transmitter chain of claim 1, wherein the impairment detection and compensation feedback circuit estimates the overall gain of the transmitter chain and generates a gain estimate, and wherein the impairment detection and compensation feedback circuit includes:
an automatic gain control (AGC) correction loop that compares the gain estimate with a pre-selected desired gain of the transmitter chain and generates a gain-compensated loop output that is a function of the difference between the gain estimate and the pre-selected desired gain;
wherein the impairment detection and compensation feedback circuit pre-distorts the baseband signal by multiplying the baseband signal with the gain-compensated loop output.

15. The direct up conversion transmitter chain of claim 1, wherein the impairment detection and compensation feedback circuit estimates direct-current (DC) bias in the RF output signal and generates a bias offset value that is proportional to the estimated DC bias, and wherein the impairment detection and compensation feedback circuit includes:
a local oscillator (LO) leakage nulling loop that generates a compensated bias parameter as a function of the bias offset value;
wherein the impairment detection and compensation feedback circuit pre-distorts the baseband signal by subtracting the compensated bias parameter from the baseband signal.

16. The direct up conversion transmitter chain of claim 1, wherein the impairment detection and compensation feedback circuit estimates phase and amplitude imbalance in the transmitter chain and generates a phase imbalance parameter and an amplitude imbalance parameter, and wherein the impairment detection and compensation feedback circuit includes:
an imbalance compensation loop that generates a desired phase compensation variable as a function of the phase and amplitude imbalance parameters and a desired amplitude compensation variable as a function of the amplitude imbalance parameter;
wherein the impairment detection and compensation feedback circuit pre-distorts the baseband signal by using the desired phase and amplitude compensation parameters to apply an inverse model of the estimated phase and amplitude imbalance to the baseband signal.

17. A method performed by a direct up conversion transmitter chain, comprising:
generating a baseband signal;
combining the baseband signal with a radio frequency (RF) carrier signal to generate an RF output signal;
transmitting the RF output signal;
down-converting the RF output signal to generate an intermediate frequency (IF) signal;
measuring at least one signal impairment in the IF signal;
pre-distorting the baseband signal to compensate for the measured signal impairment;

generating a reference voltage as a function of both an ambient temperature in the vicinity of the impairment detection and compensation feedback circuit and a battery supply voltage;

estimating actual values for the ambient temperature and the battery supply voltage; and adjusting the signal impairment by a function of the estimated ambient temperature and the estimated battery supply voltage.

18. The method of claim 17 wherein the baseband signal is a digital signal.

19. The method of claim 18 further comprising:
converting the digital baseband signal into an analog baseband signal.

20. The method of claim 17 further comprising:
filtering the RF output signal to a passband frequency range before the transmitting step.

* * * * *